United States Patent [19]

Cannella et al.

[11] 4,438,723
[45] Mar. 27, 1984

[54] MULTIPLE CHAMBER DEPOSITION AND ISOLATION SYSTEM AND METHOD

[75] Inventors: Vincent D. Cannella, Detroit; Masatsugu Izu, Birmingham; Stephen J. Hudgens, Southfield, all of Mich.

[73] Assignee: Energy Conversion Devices, Inc., Troy, Mich.

[21] Appl. No.: 306,146

[22] Filed: Sep. 28, 1981

[51] Int. Cl.³ .................... C23C 13/10; C23C 13/12
[52] U.S. Cl. .................................... 118/718; 118/719; 118/723; 118/725; 118/50.1; 118/733; 118/900; 136/258; 427/39; 427/85
[58] Field of Search ............... 118/718, 719, 725, 900, 118/733, 50.1, 729; 427/255.7, 255.5, 85, 39, 255.2, 255.1; 136/258 AM

[56] References Cited

U.S. PATENT DOCUMENTS

| | | |
|---|---|---|
| 3,294,670 | 12/1966 | Charschan et al. ............ 118/719 X |
| 3,530,057 | 9/1970 | Muly, Jr. ........................ 204/192 R |
| 3,805,736 | 4/1974 | Foehring et al. .................... 118/719 |
| 4,015,558 | 4/1977 | Small et al. ..................... 118/719 X |

*Primary Examiner*—John D. Smith
*Assistant Examiner*—Bernard F. Plantz
*Attorney, Agent, or Firm*—Marvin S. Siskind

[57] ABSTRACT

The formation of a body of material on a substrate having at least two layers of different composition is made possible by the improved system and method of the present invention with minimized cross contamination between the respective deposition environments in which the layers are deposited. The disclosure relates more specifically to the use of the system and method for the deposition of multi-layered amorphous silicon alloys to form photovoltaic devices. As a preferred embodiment of the invention, first, second, and third glow discharge deposition chambers are provided for depositing respective first, second, and third amorphous silicon alloy layers on a substrate. The second layer is substantially intrinsic in conductivity and differs in composition from the first and third layers which are of opposite conductivity type by the absence of at least one element. The second chamber is provided with starting materials including at least one gas from which the deposited layers are derived and the first and third chambers are provided with respective dopants to render the first and third layers opposite in conductivity. Contamination of the second chamber by the dopants in the first and third chambers is prevented by the establishment of unidirectional flow of the at least one gas from the second chamber to the first and third chambers.

24 Claims, 1 Drawing Figure

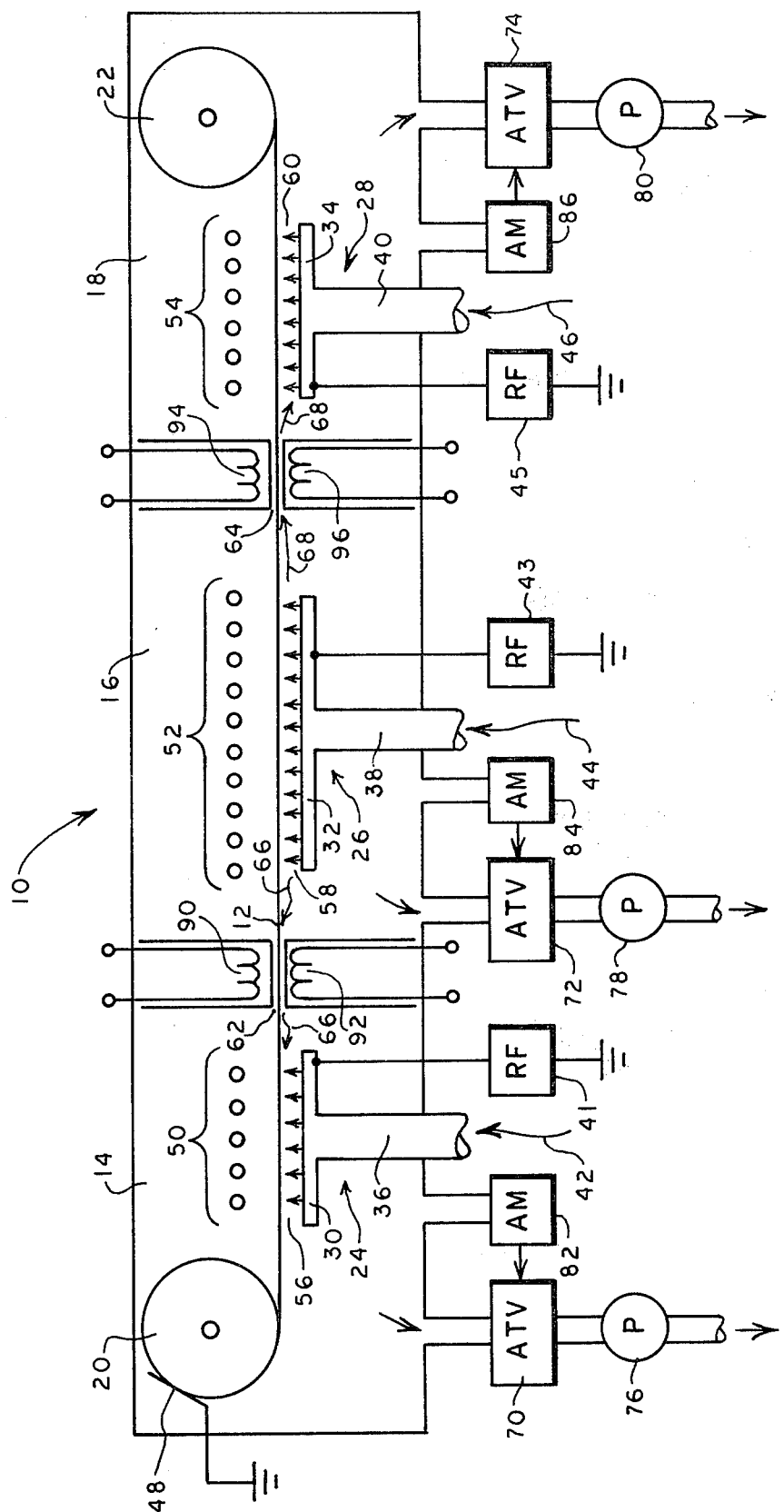

MULTIPLE CHAMBER DEPOSITION AND ISOLATION SYSTEM AND METHOD

BACKGROUND OF THE INVENTION

This invention relates to a system and method for depositing a body of material on a substrate wherein the body has at least two layers of different composition. The material can be amorphous silicon alloys having desired electrical and photoresponsive characteristics for use in devices of many kinds including photovoltaic cells. The invention has its most important application in the high volume production of photovoltaic devices including amorphous silicon photoresponsive alloys of high purity and desired composition.

Silicon is the basis of the huge crystalline semiconductor industry and is the material which has produced expensive high efficiency (18 percent) crystalline solar cells for space applications. When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impossible economic barrier to the large scale use of crystalline semiconductor solar cells for energy conversion. Further, crystalline silicon has an indirect optical edge which results in poor light absorption in the material. Because of the poor light absorption, crystalline solar cells have to be at least 50 microns thick to absorb the incident sunlight. Even if the single crystal material is replaced by polycrystalline silicon with cheaper production processes, the indirect optical edge is still maintained; hence the material thickness is not reduced. The polycrystalline material also involves the addition of grain boundaries and other problem defects.

In summary, crystal silicon devices have fixed parameters which are not variable as desired, require large amounts of material, are only producible in relatively small areas and are expensive and time consuming to produce. Devices based upon amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier and in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in Solid State Communications, Vol. 17, pp. 1193–1196, 1975, toward the end of reducing the localized states in the energy gap in amorphous silicon or germanium to make the same approximate more closely intrinsic crystalline silicon or germanium and of substitutionally doping the amorphous materials with suitable classic dopants, as in doping crystalline materials, to make them extrinsic and of p or n conduction types.

The reduction of the localized states was accomplished by glow discharge deposition of amorphous silicon films wherein a gas of silane ($SiH_4$) was passed through a reaction tube where the gas was decomposed by an r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material a gas of phosphine ($PH_3$) for n-type conduction or a gas of diborane ($B_2H_6$) for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited included supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronic properties of the amorphous material approximate more nearly those of the corresponding crystalline material.

Improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, Stanford R. Ovshinsky and Arun Madan which issued Oct. 7, 1980, and by vapor deposition as fully described in U.S. Pat. No. 4,217,374, Stanford R. Ovshinsky and Masatsugu Izu, which issued on Aug. 12, 1980, under the same title. As disclosed in these patents, fluorine is introduced into the amorphous silicon semiconductor to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its high reactivity, specificity in chemical bonding, and high electronegativity.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the new alloy so formed has a lower density or defect states in the energy gap than that achieved by the mere neutralization of dangling bonds and similar defect states. Such larger amount of fluorine, in particular, is believed to participate substantially in a new structural configuration of an amorphous silicon-containing material and facilitates the addition of other alloying materials, such as germanium.

Unlike crystalline silicon which is limited to batch processing for the manufacture of solar cells, amorphous silicon alloys can be deposited in multiple layers over large area substrates to form solar cells in high volume continuous processing systems. Continuous processing systems of this kind are disclosed, for example, in copending applications Ser. No. 151,301, filed May 19, 1980 for A Method of Making P-Doped Silicon Films and Devices Made Therefrom, Ser. No. 244,386 filed Mar. 16, 1981 for Continuous Systems For Depositing Amorphous Semiconductor Material and Ser. No. 240,493 filed Mar. 16, 1981 for Continuous Amorphous Solar Cell Production System, the latter two mentioned applications being assigned to the assignee of the present invention. As disclosed in those applications, a substrate is continuously advanced through a succession of deposition chambers with each chamber being dedicated to a specific material type deposition. In making a solar cell of PIN configuration, the first chamber is dedicated for depositing a p type amorphous silicon alloy, the second chamber is dedicated for depositing an intrinsic amorphous silicon alloy, and the third chamber is dedicated for depositing an n type amorphous silicon alloy. Each deposited alloy, and especially the intrinsic alloy must be of high purity. As a result it is necessary to isolate the deposition environment in the intrinsic deposition chamber from the doping constituents within the other chambers to prevent the diffusion of doping constituents into the intrinsic chamber. In the systems disclosed in the aforementioned copending applications, isolation between the chambers is accomplished with gas gates which pass an inert gas over the substrate as it passed from one chamber to the next. The present invention represents a further improvement in the manufacture of solar cells by continuous processing and may be advantageously employed in other applications wherein materials of different composition must be deposited on a substrate to form a multilayered body of material.

SUMMARY OF THE INVENTION

The invention provides a system and method for depositing a body of material upon a substrate wherein the body includes at least two layers of different composition. The system comprises first and second deposition chambers each including means for depositing a layer of material on a substrate. The second chamber is arranged to deposit a layer of material which differs in composition from the layer deposited by the first chamber by the absence of at least one element, which element is individually supplied to the first chamber. The system further includes source means for providing at least one gas to the second chamber. The second chamber is isolated from the at least one element in the first chamber by means which establish unidirectional flow of the at least one gas from the second chamber to the first chamber.

The invention has particular utility in the production of photovoltaic cells. In such an application, at least first, second, and third deposition chambers are provided which are arranged to receive a substrate in succession and to deposit first, second and third amorphous silicon alloy layers thereon. The first chamber is provided with a first dopant to render the first layer either p or n type in conductivity and the third chamber is provided with a different dopant to make the third layer opposite in conductivity with respect to the first layer. The second chamber is provided with at least one gas and starting materials from which the deposited amorphous silicon alloy layers are derived. It does not receive any dopants so that the second deposited layer is intrinsic. In order to isolate the second chamber from the dopants in the first and third chambers, unidirectional flow of the at least one gas is established from the second chamber to the first and third chambers. The at least one gas can include one or all of the starting materials, except for the dopants, to enable the distribution of the starting materials from the second chamber to the first and third chambers within the unidirectional flow and the precise metering of the dopants individually to the first and third chambers.

The starting materials preferably include a gas including at least hydrogen or fluorine or a fluorine containing compound. As a result, the deposited amorphous alloys incorporate at least one density of states reducing element. Other structural, compensating or altering elements can be added.

BRIEF DESCRIPTION OF THE DRAWINGS

The sole FIGURE illustrates a preferred embodiment of the present invention and is a diagrammatic representation of a multiple glow discharge chamber deposition system of the type which facilitate the continuous processing of photovoltaic cell devices, which system provides isolation between the respective deposition chambers in accordance with the system and method of the present invention.

DESCRIPTION OF THE PREFERRED EMBODIMENT

Referring now to the sole FIGURE, the multiple chamber system 10 there illustrated which embodies the present invention is particularly suited for the high volume production of large area amorphous silicon photovoltaic devices. The system 10 is arranged to produce cells of the PIN configuration on a substrate 12 formed from a web of, for example, stainless steel. To deposit the p type, intrinsic, and n type amorphous silicon alloy layers required for the PIN configuration, the system includes a first chamber 14, a second chamber 16, and a third chamber 18. Each chamber is dedicated for depositing a particular conduction type amorphous silicon alloy layer. The substrate 12 extends across the chambers 14, 16, and 18 and is moved in a continuous manner through the chambers to facilitate the successive deposition of the p type, intrinsic, and n type amorphous silicon alloys. The substrate is delivered to the chambers from a pay-out roll 20 at one end and is collected at the other end on a take-up roll 22. After processing, the take-up roll is removed and the substrate is divided up for final processing and assembly. Although the rolls 20 and 22 are within the chambers 14 and 18 respectively as illustrated, they could be external to the chambers as well if adequate sealing is provided.

Each chamber 14, 16, and 18 is arranged to deposit the amorphous silicon alloys by glow discharge deposition. To that end each chamber 14, 16, and 18 includes glow discharge deposition means 24, 26, and 28 respectively. The deposition means 24, 26, and 28 each include a cathode 30, 32, and 34 respectivley, a conduit 36, 38, and 40 respectively, and a radio frequency generator 41, 43, and 45 respectively. The conduits are coupled to the cathodes for delivering appropriate gas constituents to the cathodes which are received by the conduits as indicated by the arrows 42, 44, and 46. The gases are conducted through the cathodes and directed towards the undersurface of the substrate 12.

The substrate 12 is grounded by a wiper 48 which is coupled to ground. Also each chamber is provided with radiant heaters 50, 52, and 54 for heating the substrate to an appropriate temperature during deposition.

The cathodes in conjunction with the radio frequency generators and the grounded substrate form plasma regions 56, 58, and 60 between the cathodes and the substrate wherein the elemental constituents of the supply gases are disassociated into deposition species which are then deposited onto the substrate as amorphous silicon alloy layers.

To form the photovoltaic PIN cells, the deposition means 24 of chamber 14 deposits a p type amorphous silicon alloy on the substrate 12, the deposition means 26 of chamber 16 deposits an intrinsic amorphous silicon alloy on the substrate, and the deposition means 28 of chamber 18 deposits an n type amorphous silicon alloy on the substrate 12. As a result, the system deposits at least three amorphous silicon alloy layers on the substrate wherein the second layer deposited in chamber 16 differs in composition from the layers deposited in chambers 14 and 18 by the absence of at least one element, the doping species.

It is essential that the deposited layers be of high purity in order to form devices of high efficiency. To that end, it is necessary to provide isolation of the intrinsic chamber 16 from the chambers 14 and 18 which contain the doping species. That isolation in essence must be sufficient to enable a ratio of at least $10^4$ in doping species concentration between the intrinsic chamber 16 and the chambers 14 and 18.

In accordance with the present invention, the necessary isolation of the intrinsic chamber 16 from the doping species in chambers 14 and 18 is provided by the establishment of unidirectional flow of at least one gas from the chamber 16 to the chambers 14 and 18. As may be observed in the sole FIGURE, the chamber 16 is in communication with the chambers 14 and 18 by slots 62 and 64. The slots are dimensioned to permit the substrate to pass therethrough as it continuously moves from the pay-out roll 20, through the chambers 14, 16, and 18, and onto the take-up roll 22. These slots also conduct the unidirectional flow of the at least one gas from the chamber 16 into the chambers 14 and 18 as indicated by the arrows 66, and 68. The unidirectional flow rate and the dimensions of the slots 62 and 64 can be chosen to prevent back diffusion of the doping species from the chambers 14 and 18 into the intrinsic chamber 16.

To establish the unidirectional flow of the at least one gas from the chamber 16 to the chambers 14 and 18 through the slots 62 and 64, the first chamber 14 and second chamber 18 are maintained at a lower internal deposition pressure than the chamber 16. To that end, each chamber is provided with an automatic throttle valve 70, 72, and 74, a pump 76, 78, and 80, and an absolute manometer 82, 84, and 86. Each throttle valve is coupled to its respective chamber and to a respective pump which serves to pump from the chambers excess and spent deposition constituents. Each absolute manometer is coupled to a respective chamber and a respective one of the throttle valves.

The absolute manometers 82, 84, and 86 are calibrated together with the absolute manometer 84 being set to control the throttle valve 72 to maintain the deposition pressure within chamber 16 at 0.6 torr. The absolute manometers 82 and 86 are set to control the throttle valves 70 and 74 respectively to maintain the pressure within chambers 14 and 18 at 0.57 torr. Hence, there is a pressure differential of 0.03 torr being maintained between the chamber 14 and chamber 16 and the chamber 18 and the chamber 16 to establish the unidirectional flow of the at least one gas.

In practice, and in accordance with this preferred embodiment of the present invention, the at least one gas includes the intrinsic starting materials from which the three deposited amorphous silicon alloy layers are derived. For example, the starting gases 44 can include silicon tetrafluoride gas ($SiF_4$) plus hydrogen gas, silicon tetrafluoride gas plus silane gas ($SiH_4$), silicon tetrafluoride gas alone, or silane gas alone as desired. The starting material gases 44 are delivered into conduit 38 and thus chamber 16 at a rate which assures proper flow rate of the same through the slots 62 and 64 to sustain the plasmas in chambers 14, and 18 and to provide the required isolation from diffusion of the dopant species into the intrinsic chamber 16. For example, a flow rate of 1500 SCCM of the gases 44 with slots 62 and 64 being dimensioned 0.4 inch high ×16 inches wide ×6 inches long with the pressure in chamber 16 being 0.6 torr and the pressure in chambers 14 and 18 being 0.57 torr results in a flow rate of about 500 SCCM of the starting material gasses through the slot 62 and 64. This flow rate (500 SCCM) is both sufficient to sustain the plasmas in chambers 14 and 18 and to provide a concentration ratio of the doping species from the chambers 18 and 14 to the chamber 16 of about $10^4$. That ratio is more than sufficient to produce an intrinsic amorphous silicon alloy in chamber 16 of high purity. It must be understood that the flow rates, slot dimensions, and chamber pressure stated above constitute one example for practicing the present invention. Other flow rates, slot dimensions, and chamber pressures may also be utilized for providing effective isolation of the intrinsic chamber 16 from the chambers 14 and 18 in accordance with the present invention.

The dopants required to produce the p or n type alloys in the chambers 14 and 18 can be introduced through the conduits 36 and 40. The dopant concentration required in chamber 14 to produce the p type alloy is about 0.1 atomic percent. That dopant may be for example boron introduced in the form of diborane gas ($B_2H_6$). Other p type dopants may also be utilized. For producing a p type alloy having an increased bandgap, elements such as nitrogen, carbon, or oxygen may also be provided to the conduit 36.

The dopant concentration required in chamber 18 to produce the n type alloy is about 0.05 atomic percent and can be phosphorous introduced into conduit 40 as phosphine gas or arsenic introduced into conduit 40 as arsine gas.

As an alternative arrangement, the starting material gases may also be introduced into the chambers 14 and 18 through the conduits 36 and 40 along with the dopants while also receiving flow of the starting material gases through the slots 62 and 64. It will of course be understood that the pressure differential above described must be maintained to assure the desired unidirectional flow. As above described, the flow rate of starting material will be maintained so as to be sufficient to sustain the plasmas in the chambers 14, 16 and 18.

It may be desirable to maintain the substrate 12 at an elevated temperature as it is passed from one chamber to the next through the slots 62 and 64. This can be accomplished by providing heating coils 90, 92, 94, and 96 in close proximity to the walls of the chambers which define the slots. The coils can be powered by an AC or DC current applied to their respective terminals if the coils are, for example, formed from resistance wire.

It must be understood that the deposition chambers 14, 16, and 18 illustrated in the FIGURE are not drawn to scale. In actual practice, assuming uniform deposition rates in the three chambers, the intrinsic chamber 16 will be longer than the chambers 14 and 18. This is due to the fact that the intrinsic layer is much thicker than the n or p type layers. As an example, the p type layer can be about 50 to 500 Å thick, the intrinsic layer about 3,000 to 30,000 Å thick, and the n type layer about 50 to 500 Å thick. As can be appreciated therefore, the relative dimensions of the chambers 14, 16, and 18 depend upon the deposition rate in each chamber and the desired thicknesses of the layers being deposited.

It can be further appreciated that the present invention can be practiced by using deposition systems other than by glow discharge. For example, the chambers can be provided with sputtering or chemical vapor deposition systems. Also, each chamber, may be supplied individually with all of the required starting materials and the at least one gas unidirectionally flowed from the chamber 16 to the chambers 14 and 18 could be an inert gas such as helium or argon. Other gases could also be used when the plasma region within chamber 12 is confined away from the flow of the at least one gas as by magnets or the like. As a result, the system and method of the present invention provides great flexibility in the manner of deposition used and the materials to be deposited with isolation being provided from one chamber to the next by unidirectional flow of at least one gas between the chambers.

We claim:

1. A system for depositing a body of material upon a substrate, said body having at least two layers of different composition, said system comprising:
   a first chamber including means for depositing a first layer of material on said substrate;
   first source means for providing said first chamber with a first plurality of gases;
   a second chamber including means for depositing a second layer of material on said substrate, said second layer of material having a composition differing from the composition of said first layer by the absence of at least one element;
   second source means for providing said second chamber with at least one gas; said at least one gas differing from said first plurality of gases introduced into the first chamber by the absence of said at least one element;
   slot means interconnecting said first and second chambers;
   means for transferring said substrate from said first chamber to said second chamber through said slot means; and
   first isolation means for limiting diffusion of said at least one element from said first chamber to said second chamber, said first isolation means including means for establishing a gas flow from said slot means into said first chamber at a rate sufficient to maintain at least a $10^4$ ratio of the concentration of said at least one element in said first chamber as compared to the concentration of said at least one element in said second chamber.

2. The system as defined in claim 1 further comprising means for maintaining said first chamber at a lower pressure than said second chamber.

3. The system as defined in claim 1 further comprising:
   a third chamber including means for depositing a third layer of material on said substrate, the composition of said second layer of material differing from the composition of said third layer by the absence of at least a second element;
   third source means for providing said third chamber with a second plurality of gases; said second plurality of gases differing from the gases introduced into the second chamber by the presence of at least a second element;
   second slot means interconnecting said second and third chambers;

means for transferring said substrate from said second chamber to said third chamber through said second slot means; and second isolation means for limiting diffusion of said at least second element from said third chamber to said second chamber; said second isolation means including means for establishing a gas flow from said second slot means into said third chamber at a rate sufficient to maintain at least a $10^4$ ratio of the concentration of said at least second element in said third chamber as compared to the concentration of said at least second element in said second chamber.

4. The system as defined in claim 3 further comprising means for maintaining said third chamber at a lower pressure than said second chamber.

5. The system as defined in claim 3 wherein said means for depositing on said substrate a third layer of material comprises glow discharge deposition means.

6. The system as defined in claim 3 wherein said at least second element is an n-type dopant.

7. The system as defined in claim 3 wherein said at least second element is phosphorus or arsenic.

8. The system as defined in claim 1 wherein said at least one gas comprises an inert gas.

9. The system as defined in claim 8 wherein said inert gas is argon.

10. The system as defined in claim 8 wherein said inert gas is helium.

11. The system as defined in claim 1 wherein said means for depositing on said substrate a first layer of material comprises first deposition means, wherein said means for depositing on said substrate a second layer of material comprises second deposition means, and wherein said first and second deposition means comprise glow discharge deposition means.

12. The system as defined in claim 11 wherein said glow discharge deposition means are arranged to deposit said first and second layers of material in the form of amorphous silicon alloys.

13. The system as defined in claim 12 wherein said at least one gas includes at least silicon tetrafluoride as a starting material from which said amorphous silicon alloys are derived and wherein said glow discharge deposition means are arranged to form a plasma from at least said silicon tetrafluoride gas to form said first and second layers of amorphous silicon alloys, said alloys including at least silicon and fluorine.

14. The system as defined in claim 1 wherein said means for transferring said substrate from said first chamber to said second chamber includes means for continuously moving said substrate.

15. The system as defined in claim 1 wherein said at least one gas provided to the second chamber includes at least silicon tetrafluoride gas.

16. The system as defined in claim 1 wherein said at least one gas provided to the second chamber includes at least silane gas.

17. The system as defined in claim 1 wherein said at least one gas provided to the second chamber includes at least hydrogen gas.

18. The system as defined in claim 1 wherein said at least one element is a p-type dopant.

19. The system as defined in claim 1 wherein said at least one element is a band gap increasing element.

20. The system as defined in claim 1 wherein said at least one element includes at least one of the group consisting of boron, nitrogen, carbon, and oxygen.

21. A system for depositing at least three successive substantially amorphous silicon alloy layers of different composition upon a substrate, said system comprising:

at least first, second and third glow discharge deposition chambers for successively depositing said first, second and third alloy layers upon said substrate;

first source means for providing said first chamber with a first dopant material for rendering said first alloy layer either P or N type in conductivity;

second source means for providing said second chamber with at least a silicon containing gas from which said alloy layers are derived;

third source means for providing said third chamber with a second dopant material for rendering said third alloy layer opposite in conductivity to said first layer;

first slot means interconnecting said first and second chambers;

second slots means interconnecting said second and third chambers;

means for transferring said substrate from said first chamber to said second chamber through said first slot means, and from said second chamber to said third chamber through said second slot means;

isolation means for limiting diffusion of said dopant materials to said second chamber from said first and third chambers for rendering said second layer substantially intrinsic in conductivity, said isolation means including means for establishing a gas flow from said first and second slot means into said first and second chambers at a rate sufficient to maintain at least a $10^4$ ratio of the concentration of said dopant materials in said first and third chambers as compared to the concentration of said dopant materials in said second chamber.

22. The system as defined in claim 21 further comprising means for maintaining said substrate at an elevated temperature as said substrate is transferred through said slots.

23. The system as defined in claim 21 wherein said means for transferring said substrate through said chambers includes means for continuously moving said substrate.

24. The system as defined in claim 21 further including means for maintaining the deposition pressure within said first and third chambers below the deposition pressure within said second chamber.

* * * * *